(12) United States Patent
Weber et al.

(10) Patent No.: US 10,553,681 B2
(45) Date of Patent: Feb. 4, 2020

(54) FORMING A SUPERJUNCTION TRANSISTOR DEVICE

(71) Applicant: Infineon Technologies Austria AG, Villach (AT)

(72) Inventors: Hans Weber, Bayerisch Gmain (DE); Franz Hirler, Isen (DE); Maximilian Treiber, Munich (DE); Daniel Tutuc, St. Niklas an der Drau (DE); Andreas Voerckel, Finkenstein (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/104,465

(22) Filed: Aug. 17, 2018

(65) Prior Publication Data

US 2019/0058038 A1 Feb. 21, 2019

(30) Foreign Application Priority Data

Aug. 18, 2017 (DE) ........................ 10 2017 118 957

(51) Int. Cl.
*H01L 29/06* (2006.01)
*H01L 29/15* (2006.01)
*H01L 29/66* (2006.01)
*H01L 21/225* (2006.01)
*H01L 29/10* (2006.01)
*H01L 21/265* (2006.01)
(Continued)

(52) U.S. Cl.
CPC ...... *H01L 29/0696* (2013.01); *H01L 21/2253* (2013.01); *H01L 21/266* (2013.01); *H01L 21/26513* (2013.01); *H01L 29/1033* (2013.01); *H01L 29/157* (2013.01); *H01L 29/158* (2013.01); *H01L 29/66734* (2013.01); *H01L 29/7813* (2013.01)

(58) Field of Classification Search
CPC ............ H01L 29/7813; H01L 29/1095; H01L 29/0634; H01L 29/7802
See application file for complete search history.

(56) References Cited

U.S. PATENT DOCUMENTS

| 8,753,937 B2 * | 6/2014 | Lin ..................... H01L 21/2255 438/276 |
| 2007/0272953 A1 * | 11/2007 | Hirler ................. H01L 29/0634 257/285 |
| 2009/0166722 A1 * | 7/2009 | Hebert ................ H01L 29/0634 257/328 |

FOREIGN PATENT DOCUMENTS

DE 102017115412 A1 1/2018

* cited by examiner

*Primary Examiner* — Jaehwan Oh
(74) *Attorney, Agent, or Firm* — Murphy, Bilak & Homiller, PLLC

(57) ABSTRACT

A method includes forming first regions of a first doping type and second regions of a second doping type in first and second semiconductor layers such that the first and second regions are arranged alternately in at least one horizontal direction of the first and second semiconductor layers, and forming a control structure with transistor cells each including at least one body region, at least one source region and at least one gate electrode in the second semiconductor layer. Forming the first and second regions includes: forming trenches in the first semiconductor layer and implanting at least one of first and second type dopant atoms into sidewalls of the trenches; forming the second semiconductor layer on the first semiconductor layer such that the second layer fills the trenches; implanting at least one of first and second type dopant atoms into the second semiconductor layer; and at least one temperature process.

28 Claims, 12 Drawing Sheets

(51) Int. Cl.
*H01L 21/266* (2006.01)
*H01L 29/78* (2006.01)

A-A

EPITAXIAL
GROWTH

TEMPERATURE
PROCESS

REMOVAL

IMPLANTATION

TEMPERATURE
PROCESS

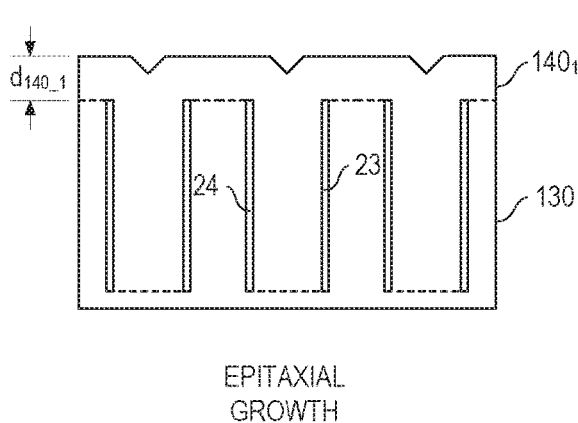
FIG 13A EPITAXIAL GROWTH
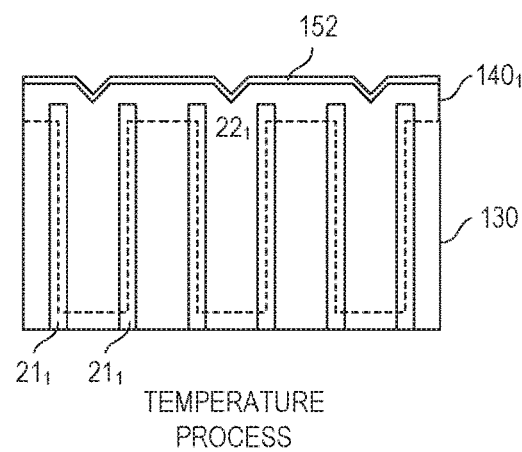
FIG 13B TEMPERATURE PROCESS
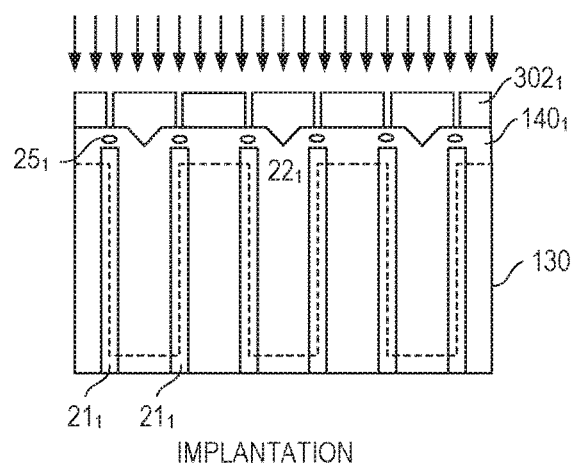
FIG 13C IMPLANTATION
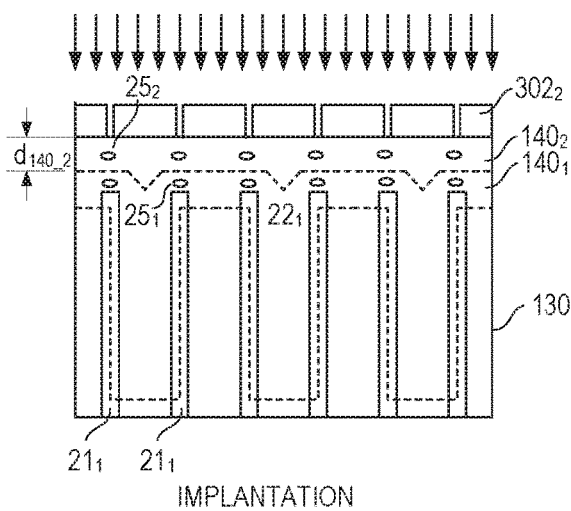
FIG 13D IMPLANTATION
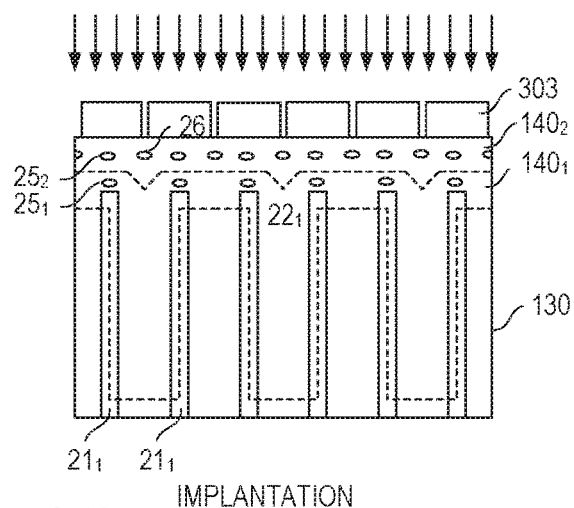
FIG 13E IMPLANTATION
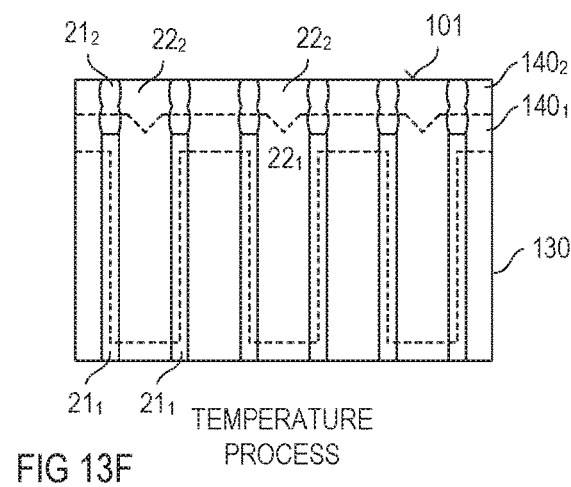
FIG 13F TEMPERATURE PROCESS

FORMING A SUPERJUNCTION TRANSISTOR DEVICE

TECHNICAL FIELD

This disclosure in general relates to a method for forming a superjunction transistor device, in particular, for forming a drift region of a superjunction transistor device.

BACKGROUND

A superjunction device, which often is also referred to as compensation device, includes a drift region with at least one region of a first doping type (conductivity type) and at least one second region of a second doping type (conductivity type) complementary to the first doping type. In some publications, the at least one first doping type region is referred to as drift region and the at least one second doping type region is referred to as compensation region.

A superjunction device may include a plurality of transistor cells, with each transistor cell including a first doping type region or a section of a first doping type region and a second doping type region or a section of a second doping type region. "The pitch" of a superjunction device is the center distance between two neighboring first doping type regions or two neighboring second doping type regions. The specific on-resistance $R_{ON}\cdot A$ of a transistor device is given by the on-resistance multiplied with the area of a semiconductor body in which the transistor device is implemented. One way to increase the specific on-resistance is to increase the number of transistor cells per unit area. Increasing the number of transistor cells is equivalent to reducing the pitch.

There is therefore a need for a method for producing a drift region of a superjunction device with a low pitch.

SUMMARY

One example relates to a method. The method includes forming a plurality of first regions of a first doping type and a plurality of second regions of a second doping type in a first semiconductor layer and a second semiconductor layer such that the first regions and the second regions are arranged alternately in at least one horizontal direction of the first and second semiconductor layers, and forming a control structure with a plurality transistor cells each including at least one body region, at least one source region and at least one gate electrode in the second semiconductor layer. Forming the first regions and the second regions include forming a plurality of trenches in the first semiconductor layer and implanting at least one of first type dopant atoms and second type dopant atoms into sidewalls of the plurality of trenches, forming the second semiconductor layer on the first semiconductor layer such that the second semiconductor layer fills the plurality of trenches in the first semiconductor layer, implanting at least one of first type dopant atoms and second type dopant atoms into the second semiconductor layer, and at least one temperature process.

Those skilled in the art will recognize additional features and advantages upon reading the following detailed description, and upon viewing the accompanying drawings.

BRIEF DESCRIPTION OF THE FIGURES

Examples are explained below with reference to the drawings. The drawings serve to illustrate certain principles, so that only aspects necessary for understanding these principles are illustrated. The drawings are not to scale. In the drawings the same reference characters denote like features.

FIGS. 13A to 13F illustrate another example of a method for forming the second semiconductor layer on the first semiconductor layer and for forming doped regions in the second semiconductor layer;

DETAILED DESCRIPTION

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
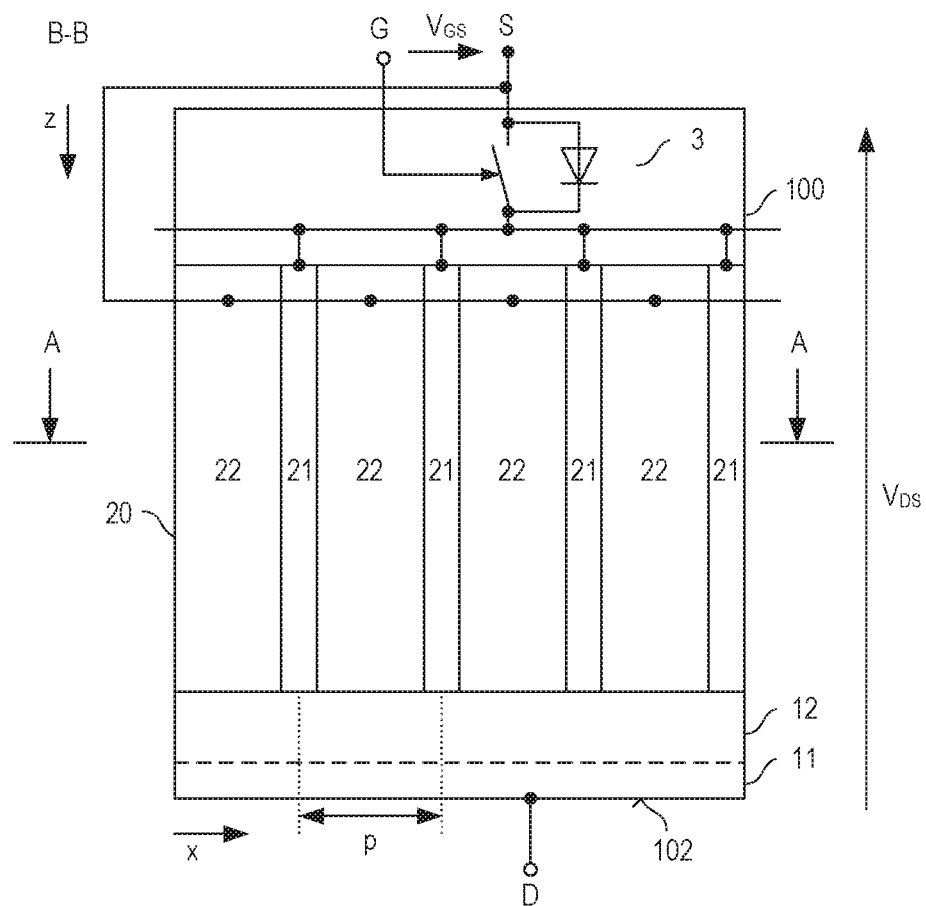
FIG. 1 shows a vertical cross sectional view of a superjunction transistor device according to one example.

FIG. 1 schematically illustrates a sectional view of one section of a transistor device, in particular, a superjunction transistor device. Referring to FIG. 1, the transistor device includes a semiconductor body 100. The semiconductor body 100 may include a conventional semiconductor material such as, for example, silicon (Si) or silicon carbide (SiC). In the semiconductor body, the transistor device includes a drift region 20 with a plurality of first regions 21 of a first doping type (conductivity type) and a plurality of second regions 22 of a second doping type (conductivity type) complementary to the first doping type. The first regions 21 and the second regions 22 are arranged alternately in at least one horizontal direction x of the semiconductor body 100, and a pn-junction is formed between each first region 21 and a corresponding adjoining second region 22. A pitch p of the semiconductor structure with the first and second semiconductor regions 21, 22 is given by a center distance between two neighboring first semiconductor regions 21 or a center distance between two neighboring second semiconductor regions 22.

Referring to FIG. 1, the first regions 21 are connected to a drain node D of the transistor device, and the second regions 22 are connected to a source node S of the transistor device. A connection between the second regions 22 and the source node S is only schematically illustrated in FIG. 1. Examples of how these connections can be implemented are explained with reference to examples herein further below. The first regions 21 are connected to the drain node D via a drain region 11 of the first doping type. The drain region 11 may adjoin the first regions 21. This, however, is not shown in FIG. 1. Optionally, as shown in FIG. 1, a buffer region 12 of the first doping type is arranged between the drain region 11 and the first regions 21. The buffer region 12 has the first doping type, which is the doping type of the drift regions 21 and the drain region 11. According to one example, a doping concentration of the buffer region 12 is lower than a doping concentration of the drain region 11. The doping concentration of the drain region 11 is selected from a range of between $1E17 (=10^{17})$ $cm^{-3}$ and $1E20$ $cm^{-3}$, for example, and the doping concentration of the buffer region 12 is selected from a range of between $1E14$ $cm^{-3}$ and $1E17$ $cm^{-3}$, for example. According to one example, the buffer region 12 includes two or more differently doped sub-regions (not shown). One of these sub-regions may have a doping concentration of between $1E14$ $cm^{-3}$ and $5E15$ $cm^{-3}$, and another one of these sub-regions may have a doping concentration of between $5E15$ $cm^{-3}$ and $1E17$ $cm^{-3}$.

Referring to FIG. 1, the transistor device further includes a control structure 3 connected between the source node S and the first regions 21. The control structure 3 is at least partially integrated in a semiconductor body 100. Examples of how the control structure 1 may be implemented are explained with reference to examples herein further below. The control structure furthermore includes a gate node G and is configured to control a conducting channel between the source node S and the first regions 21 dependent on a voltage $V_{GS}$ between the gate node G and the source node S. In the example shown in FIG. 1, this function of the control structure 1 is represented by a switch connected between the source node S and the first regions 21. Furthermore. the control structure 1 includes a pn-junction between the first regions 21 and the source node S. In the example shown in FIG. 1, this pn-junction is represented by a bipolar diode connected between the first regions 21 and the source node S.

The transistor device has a current flow direction, which is a direction in which a current may flow between the source node S and the drain node D inside the semiconductor body. In the example shown in FIG. 1, the current flow direction is a vertical direction z of the semiconductor body 100. The vertical direction z is a direction perpendicular to a first surface (not shown in FIG. 1) and a second surface 102 that is formed by the drain region 11. FIG. 1 shows a vertical cross sectional view of the drift region 20, the drain region 11, and the optional buffer region 12. The "vertical cross sectional view" is a sectional view in a section plane perpendicular to the first surface and the second surface 102 and parallel to the vertical direction z. Section planes perpendicular to the vertical section plane shown in FIG. 1 are referred to as horizontal section planes in the following.

Figure 2:
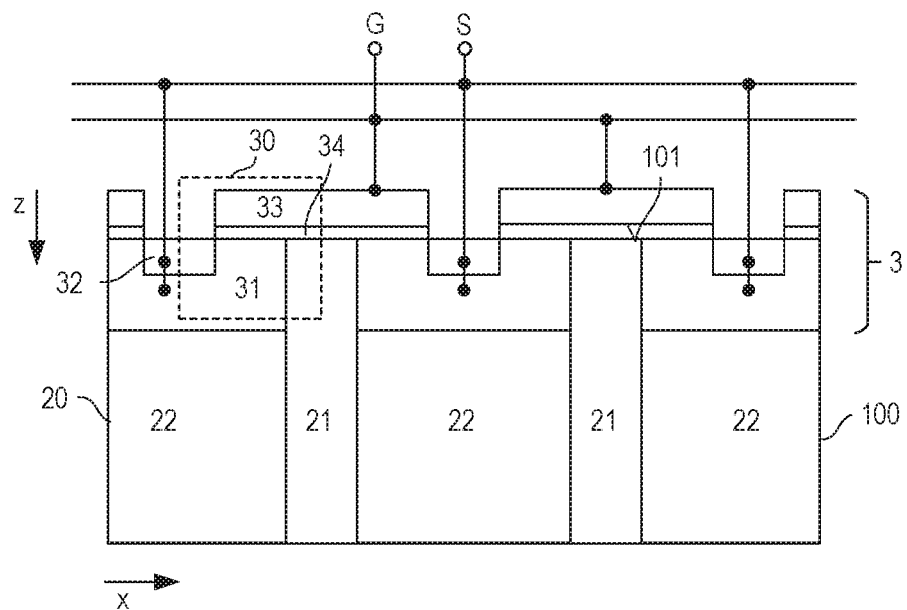
FIG. 2 shows one example of a control structure of the transistor device shown in FIG. 1.

FIG. 2 shows one example of the control structure 3 in a greater detail. Besides the control structure 3, portions of the drift region 20 adjoining the control structure 3 are shown in FIG. 2. In the example shown in FIG. 2 the control structure 3 includes a plurality of control cells 30, which may also be referred to as transistor cells. Each of these control cells 30 includes a body region 31 of the second doping type, a source region 32 of the first doping type, a gate electrode 33, and a gate dielectric 34. The gate dielectric 34 dielectrically insulates that gate electrode 33 from the body region 31. The body region 31 of each control cell 30 separates the respective source region 32 of the control cell 30 from at least one of the plurality of first regions 21. The source region 32 and the body region 31 of each of the plurality of control cells 30 is electrically connected to the source node S. "Electrically connected" in this context means ohmically connected. That is, there is no rectifying junction between the source node S and the source region 32 and the body region 31. Electrical connections between the source node S and the source region 32 and the body region 31 of the individual control cells 30 are only schematically illustrated in FIG. 2. The gate electrode 33 of each control cell 30 is electrically connected to the gate node G.

Referring to the above, the body region 31 of each control cell 30 adjoins at least one first region 21. As the body region 31 is of the second doping type and the first region 21 is of the first doping type there is a pn-junction between the body region 31 of each control cell 30 and the at least one first region 21. These pn-junctions form the pn-junction of the control structure 3 that is represented by the bipolar diode in the equivalent circuit diagram of the control structure 3 shown in FIG. 1.

In the example shown in FIG. 2, the gate electrode 33 of each control structure 30 is a planar electrode arranged on top of the first surface 101 of the semiconductor body 100 and dielectrically insulated from the semiconductor body 100 by the gate dielectric 34. In this example, sections of the first regions 21, adjacent the individual body regions 31, extend to the first surface 101.

Figure 3:
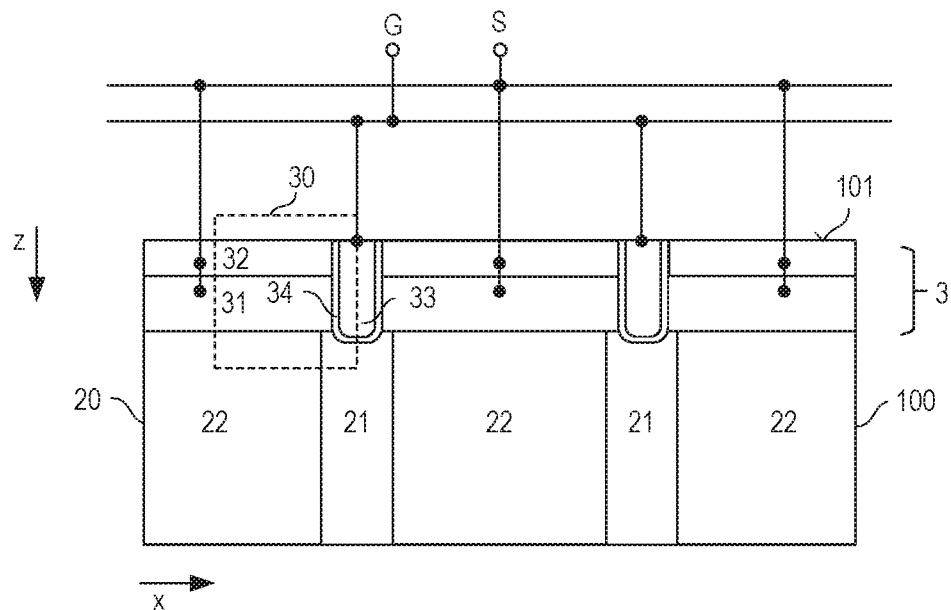
FIG. 3 shows another example of a control structure of the transistor device shown in FIG. 1.

FIG. 3 shows a control structure 3 according to another example. The control structure 3 shown in FIG. 3 is different from the control structure 3 shown in FIG. 2 in that the gate electrode 33 of each control cell 30 is a trench electrode. This gate electrode 33 is arranged in a trench that extends from the first surface 101 into the semiconductor body 100. Like in the example shown in FIG. 2, a gate dielectric 34 dielectrically insulates the gate electrode 33 from the respective body region 31. The body region 31 and the source region 32 of each control cell 30 are electrically connected to the source node S. Further, the body region 31 adjoins at least one first region 21 and forms a pn-junction with the respective first region 21.

In the examples shown in FIGS. 2 and 3, the control structures 30 each include one gate electrode 33, wherein the gate electrode 33 of each control cell 30 is configured to control a conducting channel between the source region 32 of the respective control cell 30 and one first region 21, so that each control cell 30 is associated with one first region 21. Further, as shown in FIGS. 2 and 3, the body region 31 of each control cell 30 adjoins at least one second region 22, so that the at least one second region 22 is electrically connected to the source node S via the body region 31 of the control cell 30. Just for the purpose of illustration, in the examples shown in FIGS. 2 and 3, the body region 31 of each control cell 30 adjoins one second region 22 so that each control cell 30 is associated with one second region. Furthermore, in the examples, shown in FIGS. 2 and 3, the source regions 32 of two (or more) neighboring control cells 30 are formed by one doped region of the first doping type, the body regions 31 of two (or more) neighboring control cells 30 are formed by one doped region of the second doping type, and the gate electrodes 33 of two (or more) control cells 30 are formed by one electrode. The gate electrodes 33 may include doped polysilicon, a metal, or the like. According to one example, a doping concentration of the source regions 32 is selected from a range of between $1E18$ cm$^{-3}$ and $1E21$ cm$^{-3}$, and a doping concentration of the body regions 31 is selected from a range of between $1E16$ cm$^{-3}$ and $5E18$ cm$^{-3}$.

Figure 4:
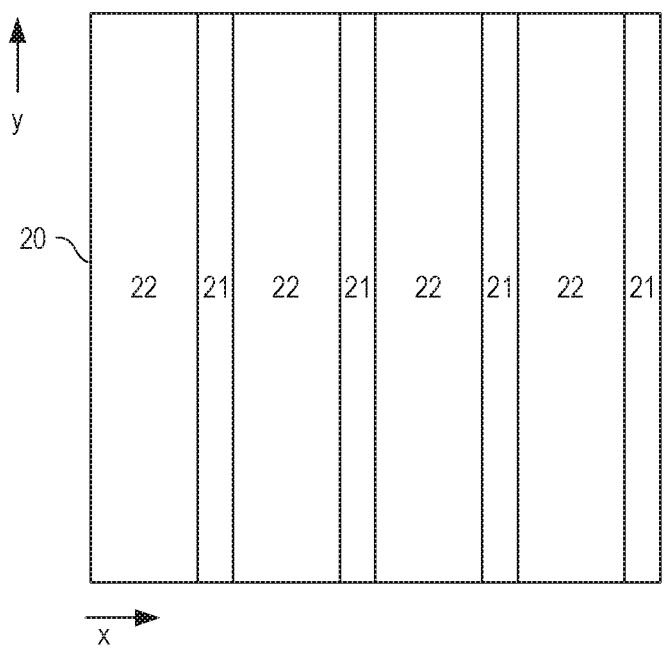
FIG. 4 shows a horizontal cross sectional view of one example of a drift region of a transistor device.
Figure 5:
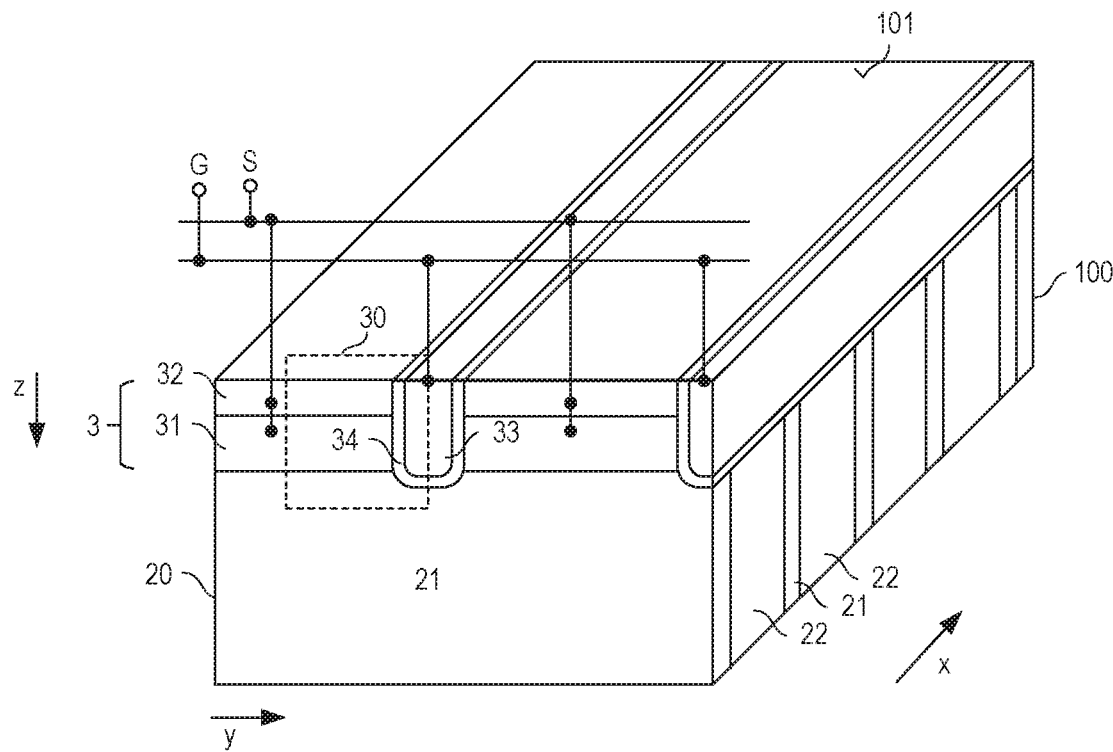
FIG. 5 shows a perspective sectional view of one example of a superjunction transistor device.

FIG. 5 shows a perspective sectional view of the drift region 20 according to one example. In this example, the first regions 21 and the second regions 22 are elongated in one lateral direction of the semiconductor body 100. Just for the purpose of illustration, this lateral direction is a second lateral direction y perpendicular to the first lateral direction x. "Elongated" means that a length of the first and second regions 21, 22 is significantly greater than a width. The "length" is a dimension in one direction, which may be referred to as longitudinal direction, and the "width" is a dimension in a direction perpendicular to the longitudinal direction. In the example shown in FIG. 4, the length is the dimension in the second lateral direction y of the semiconductor body 100, and the width is the dimension in the first lateral direction x of the semiconductor body 100. According to one example, "significantly greater" means that a ratio between the length and the width is greater than 10, greater than 100, or even greater than 1000.

Associating one control cell 30 of the plurality of control cells with one first region 21 and one second region 22, as illustrated in FIGS. 2 and 3, is only an example. The implementation and the arrangement of the control cells 30 of the control structure 3 are widely independent of the specific implementation and arrangement of the first regions 21 and the second regions 22.

One example illustrating that the implementation and arrangement of the control structure 3 are widely independent of the implementation and arrangement of the first and second regions 21, 22 is shown in FIG. 5. In this example, the first regions 21 and the second regions 22 are elongated in the second lateral direction y of the semiconductor body 100, while the source regions 32, the body regions 31, and the gate electrodes 33 of the individual control cells 30 of the control structure 3 are elongated in the first lateral direction x perpendicular to the second lateral direction y. In this example, the body region 31 of one control cell 30 adjoins a plurality of first regions 21 and second regions 22.

The functionality of a transistor device of the type explained herein above is explained below. The transistor device can be operated in a forward biased state and a reverse biased state. Whether the device is in the forward biased state or the reverse biased state is dependent on a polarity of a drain-source voltage $V_{DS}$, which is a voltage between the drain node D and the source node S. In the reverse biased state the polarity of the drain-source voltage $V_{DS}$ is such that the pn-junctions between the body regions 31 and the first regions 21 of the drift region 20 are forward biased, so that in this operation state the transistor device conducts a current independent of an operation state of the control structure 3. In the forward biased state, the polarity of the drain-source $V_{DS}$ is such that the pn-junctions between the body regions 31 and the first regions 21 are reverse biased. In this forward biased state, the transistor device can be operated in an on-state or an off-state by the control structure 3. In the on-state, the control structure 3 generates a conducting channel between the source node S and the first regions 21, and in the off-state this conducting channel is interrupted. More specifically, referring to FIGS. 2 and 3, in the on-state there are conducting channels in the body regions 31 between the source regions 32 and the first regions 21 controlled by the gate electrodes 33. In the off-state, these conducting channels are interrupted. The gate electrodes 33 are controlled by a gate-source voltage $V_{GS}$, which is a voltage between the gate node G and the source node S.

The transistor device can be implemented as an n-type transistor device or as a p-type transistor device. In an n-type transistor device, the first doping type, which is the doping type of the first regions 21, the source regions 32, the drain region 11 and the optional buffer region 12 is an n-type and the second doping type, which is the doping type of the second regions 22 and the body regions 31, is a p-type. In a p-type transistor device, the doping types of the device regions mentioned before are complementary to the doping types of the respective device regions in an n-type transistor device. An n-type transistor device, for example, is in the forward biased state if the drain-source voltage $V_{DS}$ is a positive voltage. Furthermore, an n-type transistor device is in the on-state if the gate-source voltage $V_{GS}$ is positive and higher than a threshold voltage of the transistor device.

It is desirable to have a transistor device with a low specific on-resistance $R_{ON} \cdot A$ at a given voltage blocking capability and a high avalanche robustness. The specific on-resistance $R_{ON} \cdot A$ is the electric resistance between the drain node D and the source node S in the on-state multiplied with the size A of the semiconductor body 100 in which the transistor device is integrated. In the examples explained before. The "size" of the semiconductor body is the area of the first surface 101, for example. The specific on-resistance can be decreased by decreasing the pitch p. It is therefore desirable to implement a drift region 20 with a low pitch p, and in a cost efficient way.

Figure 6:
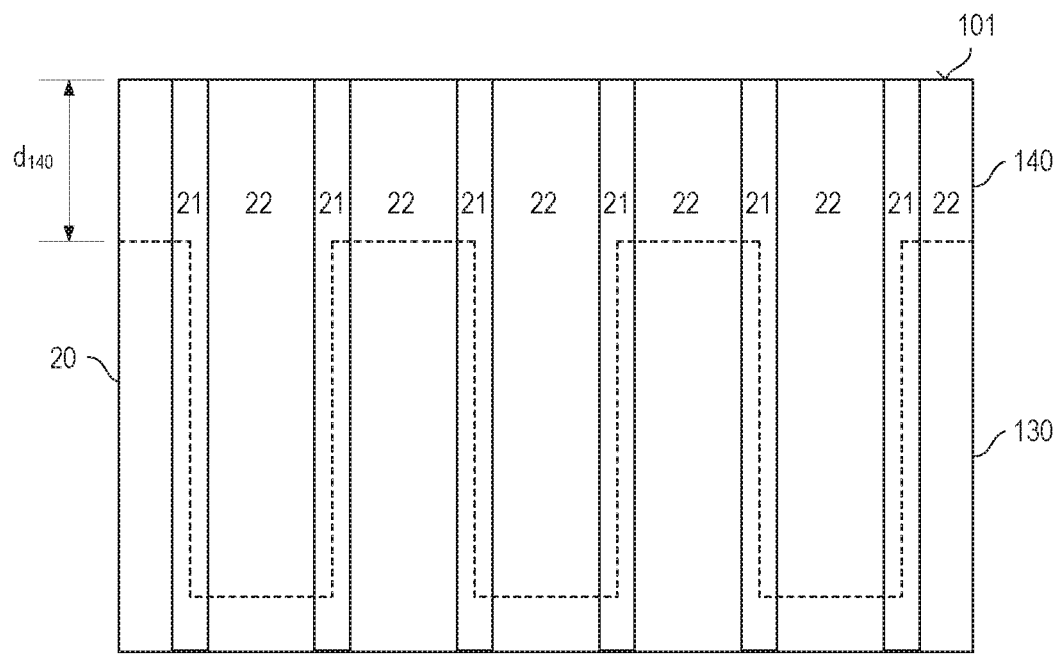
FIG. 6 shows a vertical cross sectional view of one section of a drift region that includes a plurality of first regions of a first doping type and second regions of a second doping type in a first semiconductor layer and a second semiconductor layer.

FIG. 6 shows a vertical cross sectional view of the semiconductor body 100 after forming the first and second regions 21, 22, but before forming the control structure 3 with the control cells (transistor cells) 30. Forming these control cells 30 includes forming the body and source regions 31, 32 in the semiconductor body 100, and forming the gate dielectrics 34 and the gate electrodes 33 adjacent the body regions 31 on top of or in trenches of the semiconductor body 100. Forming the body regions 31 and the source regions 32 may include implanting second type dopant atoms for the body regions 31 and first type dopant atoms for the source regions 32, and a temperature process that activates the implanted dopant atoms. "First type dopant atoms" are dopant atoms of the first doping type, and "second type dopant atoms" are dopant atoms of the second doping type. The dopant atoms may be implanted before or after forming the gate electrodes 33 and gate dielectrics 34. Referring to the above, the body region 31 of each control cell 30 adjoins at least one first region 21 and at least one second region 22. Thus, before forming the body regions 31, the first regions 21 and second regions 22 should extend to the first surface 101 or should, at least, be spaced apart from the first surface 101 less than a vertical dimension of the body regions 31. Just for the purpose of illustration, the first and second regions 21, 22 shown in FIG. 6 each extend to the first surface 101 of the semiconductor body 100.

According to one example, the body regions 31 are formed such that a distance between the first surface 101 and a junction between the body regions 31 and the first and second regions 21, 22 is between 0.5 micrometers (μm) and 3 micrometers. A thickness $d_{140}$ of the second semiconductor layer 140 on top of mesa regions of the first semiconductor layer 130 is between zero and 6 micrometers, for example. "Mesa regions" are those regions of the first semiconductor layer 130 that are located between the trenches. If the thickness $d_{140}$ on top of the mesa regions is zero the second semiconductor layer 140 fills the trenches but is not arranged on top of the mesa regions.

According to one example, the semiconductor body 100 includes a first semiconductor layer 130 and a second semiconductor layer 140 formed on the first semiconductor layer 130. The first semiconductor layer 130, before forming the second semiconductor layer 140, includes a plurality of trenches, wherein the second semiconductor layer 140 fills these trenches. According to one example, the semiconductor body 100 with the first semiconductor layer 130 and the second. semiconductor layer 140 is a monocrystalline semiconductor body. That is, based on the crystalline structure of the semiconductor body 100 the first and second semiconductor layers 130, 140 cannot be detected. In other words, there is no visible border or interface between the first semiconductor layer 130 and the second semiconductor layer 140. Nevertheless, for the purpose of illustration and explanation, a border between the first semiconductor layer 130 and the second semiconductor layer 140 is illustrated in dashed lines in FIG. 6. Referring to FIG. 6, the first and second regions 21, 22 are formed in the first semiconductor layer 130 and the second semiconductor layer 140. Examples of how the first semiconductor layer 130 and the second semiconductor layer 140 can be formed are explained in detail herein further below.

FIG. 6 only shows one section of the semiconductor body 100 before forming the control cells 3, namely a section that includes the first semiconductor layer 130 and the second semiconductor layer 140. Besides the first semiconductor layer 130 and the second semiconductor layer 140, the semiconductor body 100 may include further semiconductor layers or substrates. Examples are explained with reference to FIGS. 7 and 8 below.

Figure 7:
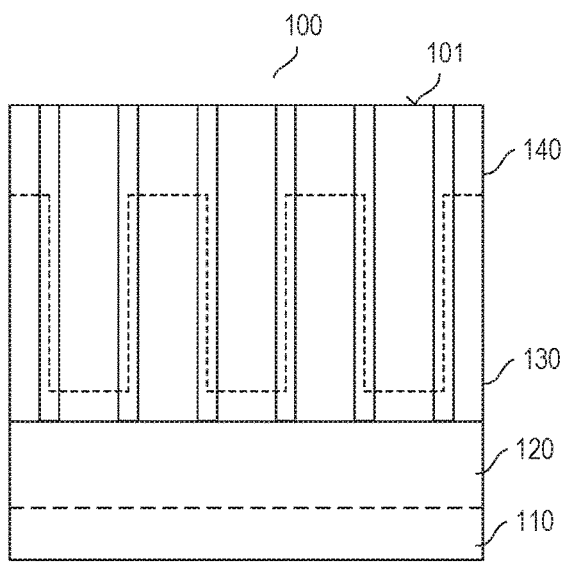
FIG. 7 illustrates one example how the first semiconductor layer may be arranged in a semiconductor body.

FIG. 7 shows a vertical cross sectional view of one example of the semiconductor layer 100. In this example, the semiconductor layer 100 includes a substrate 110 and the first semiconductor layer 130 and the second semiconductor layer 140 are formed on top of the substrate 110. According to one example, the substrate 110, or sections of the substrate 110, form the drain region (see 11 in FIG. 1) of the finished transistor device. Optionally, an epitaxial layer 120 is arranged between the substrate 110 and the first semiconductor layer 130. This epitaxial layer 120 forms the buffer region (see 12 in FIG. 1) in the finished transistor device.

Figure 8:
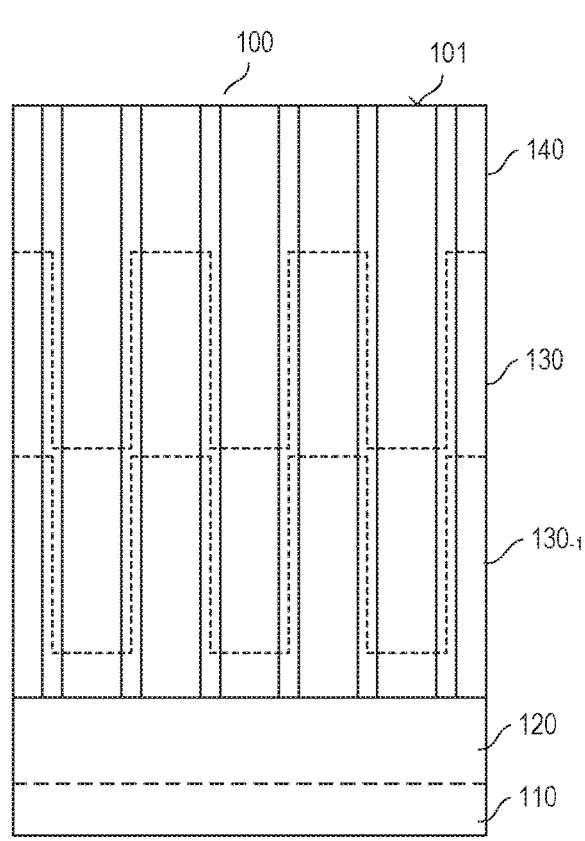
FIG. 8 illustrates another example how the first semiconductor layer may be arranged in a semiconductor body.

According to another example, one or more semiconductor layers of the type of the first layer 130 are formed between the first layer 130 and the substrate 110 or between the first layer 130 and the optional epitaxial layer 120. FIG. 8 shows one example of a semiconductor body 100 that includes one such further semiconductor layer $130_{-1}$ between the first semiconductor layer 130 and the optional epitaxial layer 120. In this example, the further layer $130_{-1}$ is formed to have a plurality of trenches and the first semiconductor layer 130 is formed to fill these trenches $130_{-1}$ before the trenches in the first layer 130 are formed. The trenches in the further layer $130_{-1}$ before forming the first layer 130 are illustrated in dashed lines in FIG. 8. In the example shown in FIG. 8, positions of the trenches in the first layer 130 and positions of the trenches in the further layer $130_{-1}$ are aligned in the vertical direction of the semiconductor body 100. This, however, is only an example. According to another example (not shown), positions of the trenches in the first layer 130 are offset in a lateral direction of the semiconductor body 100 relative to positions of the trenches in the further layer $130_{-1}$. The "lateral direction" of the semiconductor body 100 is a direction parallel to the first surface 101 and perpendicular to the vertical direction.

Figure 9:
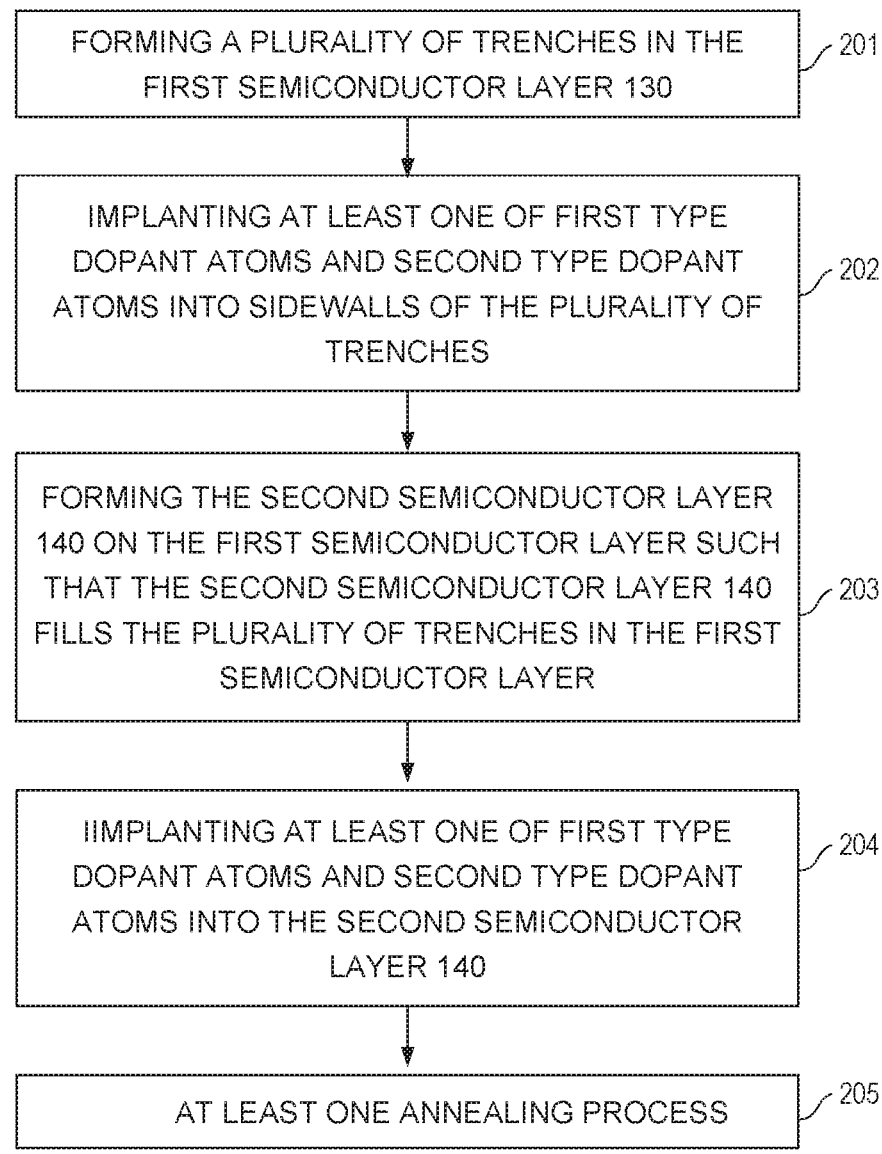
FIG. 9 shows a flowchart of a method for forming the drift region.

FIG. 9 shows a flowchart that illustrates one example of a method for forming the first regions 21 and the second regions 22 in the first semiconductor layer 130 and the second semiconductor layer 140. Referring to FIG. 9, the method includes forming a plurality of trenches in the first semiconductor layer 130 (stage 201), implanting first type dopant atoms and second type dopant atoms into sidewalls of the plurality of trenches (stage 202), forming the second semiconductor layer 140 on the first semiconductor layer such that the second semiconductor layer 140 fills the plurality of trenches in the first semiconductor layer 130 (stage 203), implanting at least one of first type dopant atoms and second type dopant atoms into the second semiconductor layer 140 (stage 204), and at least one temperature process (stage 205). Examples of methods that include these stages 201 to 205 shown in FIG. 9 are explained herein further below.

Figure 10A:
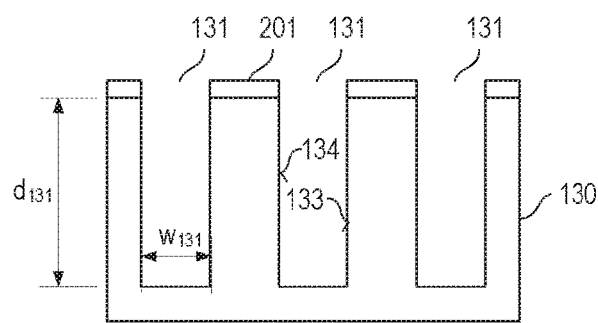
FIGS. 10A and 10B show a vertical cross sectional views of the first semiconductor layer during different process steps.
Figure 10B:
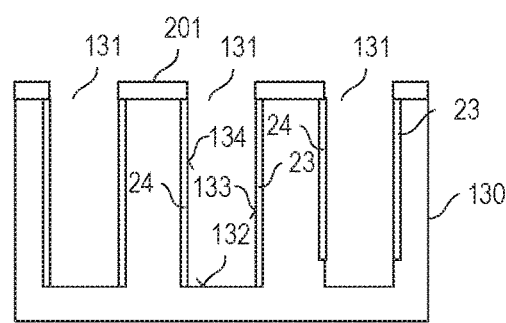

FIGS. 1.0A and 10B illustrate one example of stages 201 and 202. That is, FIGS. 10A and 10B illustrate one example of forming trenches in the first semiconductor layer 130 and implanting first type dopant atoms and second type dopant atoms into sidewalk of the trenches. Each of these FIGS. 10A and 10B shows a vertical cross sectional view of the first semiconductor layer 130. FIG. 10A shows the first semiconductor layer 130 after forming a plurality of trenches 131 in a surface of the semiconductor layer 130. According to one example, forming these trenches 131 includes forming an etch mask 201 on the surface of the semiconductor layer 130, and forming the trenches 131 by etching the surface of the first semiconductor layer 130 in those sections of the surface not covered by the etch mask 201. According to one example, the etching process may include at least one of a dry etching process or a wet etching process. According to one example, the trenches 131 are formed such that an aspect ratio, which is a ratio $d_{131}/w_{131}$ between a depth $d_{131}$ and a width $w_{131}$ is between 1:1 and 5:1. The depth $d_{131}$ is selected from between 3 micrometers (μm) and 20 micrometers, for example.

FIG. 10B shows the first semiconductor layer 130 after implanting at least one of first type dopant atoms and second type dopant atoms into at least one of first and second sidewalls 133, 134 of the trenches 131. In FIG. 10B, reference number 23 denotes a first implantation region adjoining the first sidewall 133, and reference number 24 denotes a second implantation region adjoining the second sidewall 134 of each trench 131. Each of these first and second implantation regions 23, 24 includes at least one type of dopant atoms. According to one example, each of the first implantation regions 23 and the second implantation regions 24 include both first type dopant atoms and second type dopant atoms. Implanting both types of dopant atoms into one sidewall may include implanting molecules or complexes that include both first type dopant atoms and second type dopant atoms into the respective sidewall. According to one example, in order to prevent dopant atoms from being implanted into the surface of the first semiconductor layer 130 outside the trenches 131, the etch mask 201 remains in place during the implantation process. Dopant atoms of both types may be implanted into only one of the first sidewalls 133 and the second sidewalls 134 or into both of the first sidewalls 133 and the second sidewalls 134. According to one example, if dopant atoms of both types are implanted into one sidewall, the dopant atoms may be chosen such that they have different diffusion coefficients. According to one example, the first type dopant atoms are arsenic (As) or antimony (Sb) atoms, and the second type dopant atoms are boron (B) atoms. Boron, which is a p-type dopant, diffuses faster than As or Sb, which are n-type dopants.

According to another example, each of the first implantation region 23 and the second implantation region 24 includes only one type of dopant atoms. That is, the first implantation regions 23 only include one of the first type dopant atoms and the second type dopant atoms, and the second implantation regions 24 includes the other one of the first type dopant atoms and the second type dopant atoms.

According to yet another example, dopant atoms of only one type, such as first type dopant atoms, are implanted into at least one of the first sidewalls 133 and the second sidewalls 134. That is, the dopant atoms of one type are implanted into one or both of the first sidewalls 133 and the second sidewalls 134.

Referring to FIG. 10B, the first and second implantation regions 23, 24 can he formed such that, along the sidewalls 133, 134, these implantation regions extend from a surface of the first layer 130 to a bottom 132 of the trenches 131. According to another example, illustrated on the right side in FIG. 10B, the first and second implantation regions 23, 24 are formed such that they are spaced apart from the bottom 132 in a vertical direction of the first semiconductor layer 130.

FIGS. 11A to 11E, 12, 13A to 13F, 14A to 14D, 15A to 15D, and 16A to 16D illustrate examples of methods for forming the second layer 140 on the first layer 130. Each of these methods is based on the structure shown in FIG. 10B, that is, on the first semiconductor layer 130 with the plurality of trenches 133 and the implantation regions along the first and second sidewalls 133, 134 of the trenches 131. In these methods, forming the second semiconductor layer 140, inter alia, includes forming the second semiconductor layer 140 such that it fills the trenches 131 in the first layer 130 and has an essential planar surface, and forming the first and second regions 21, 22, inter alia, includes forming the first and second regions 21, 22 such that they extend to the first surface 101 of the semiconductor body 100 before forming the control cells 30.

Figure 11A:
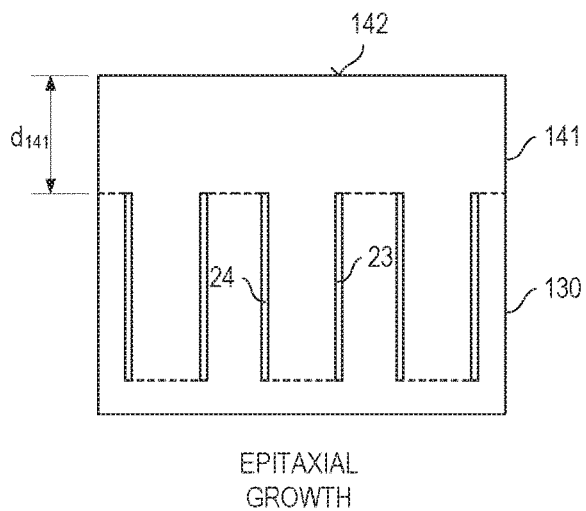
FIGS. 11A to 11E illustrate one example of a method for forming the second semiconductor layer on the first semiconductor layer and for forming doped regions in the second semiconductor layer.

Referring to FIG. 11A, the method illustrated in FIGS. 11A to 11E includes forming an epitaxial layer 141 on the first semiconductor layer 130. The epitaxial layer 141 is formed in the trenches and on top of mesa regions of the first semiconductor layer 130, "Mesa regions" are regions of the first semiconductor layer 130 between the trenches 131. According to one example, the epitaxial layer 141 is grown such that a surface 142 of the epitaxial layer 141 is essentially planar. "Substantially planar", according to one example, means that a distance, in the vertical direction, between a position of the lowest point and a position of the highest point in the surface 142 is less than 15%, less than 10%, or less than 5% of a depths of the trenches 131 in the first semiconductor layer 130 (see FIGS. 10A and 10B). The "depths" of the trenches 131 is the dimension of the trenches 131 in the vertical direction of the first semiconductor layer 130. "Substantially planar" may include that the distance, in the vertical direction, between the position of the lowest point and the position of the highest point is less than 1 (one) micrometer. According to one example, a thickness $d_{141}$ of the epitaxial layer 141 on top of the mesa regions of the first semiconductor layer 130 is between 0.7 times and 2 times, in particular between 0.9 times and 1.5 times a width $w_{131}$ of the trenches 131 (see FIG. 10A).

Figure 11B:
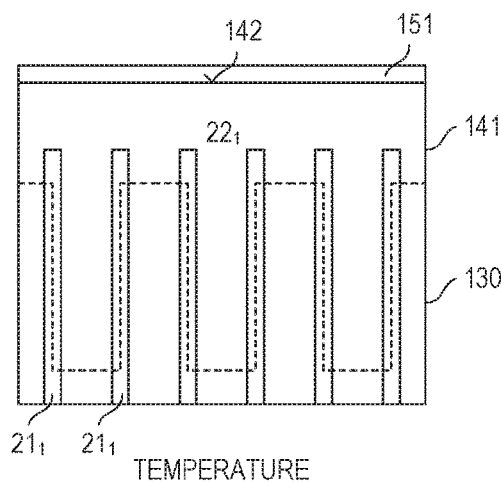

Referring to FIG. 11B, the method includes a first temperature process. FIG. 11B illustrates the arrangement with the first semiconductor layer 130 and the epitaxial layer 141 after this temperature process. In this temperature process, dopant atoms from the implantation region 23 and 24 diffuse in the first semiconductor layer 130 and the epitaxial layer 141. In the example shown in FIG. 11B, dopant atoms of both types have been implanted into both, the first and second sidewalls. These dopant atoms diffuse during the temperature process. In this example, the first epitaxial layer 141 may be non-doped (intrinsic). In the example shown in FIG. 11B, first type dopant atoms form first sections $21_1$ of the first regions (21 in FIG. 11) and second type dopant atoms form first sections $22_1$ of the second regions (22 in FIG. 1). In this example, the first type dopant atoms have a lower diffusion coefficient than the second type dopant atoms so that the first region sections $21_1$ do not extend as far in the lateral direction and the vertical direction as the second region section $22_1$. In particular, in the example shown in FIG. 11B, the second region section $22_1$ extends to the surface 142 of the epitaxial layer 141, while the first region sections $21_1$ are spaced apart from this surface 142. The temperature process may include a thermal oxidation process in which an oxide layer 151 is formed on top of the epitaxial layer 141. This oxide layer 151 is removed before a further processing takes place.

According to another, the first and second implantation regions 23, 24 are formed to include first type dopant atoms, only. In this case, the first epitaxial layer 141 is formed to have a basic doping of the second doping type and already forms the second region section $22_1$ before the temperature process.

Figure 11C:
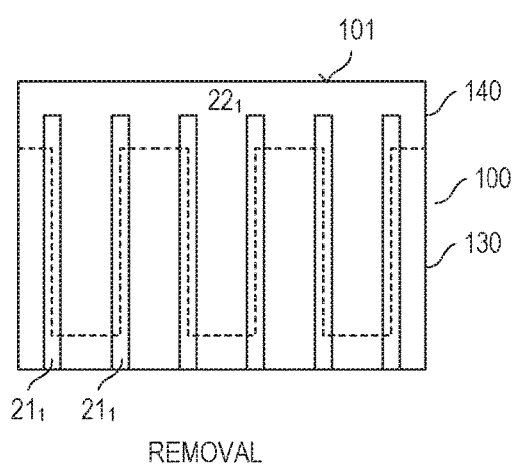
Figure 11D:
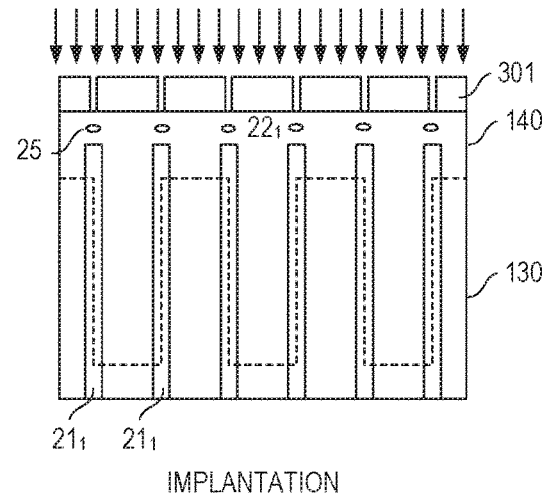
Figure 11E:
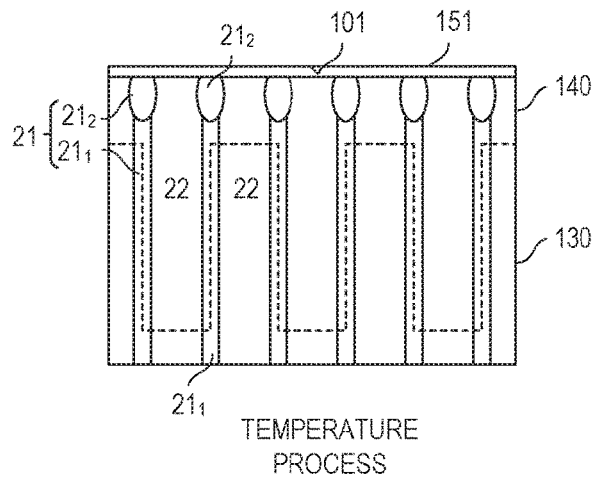

Referring to FIG. 11C, the method further includes removing a section of the epitaxial layer 141 thereby forming the second semiconductor layer 140, wherein a surface of the second semiconductor layer forms the surface 101 of the semiconductor body. Partially removing the epitaxial layer 141 may include at least one of a polishing or etching process. According to one example, the removal process is such that, after the removal process, a distance between the first region sections $21_1$ and the first surface 101 is between 50 nanometers (nm) and 1.5 micrometers (μm).

After the removal process shown in FIG. 11C, the first region sections $21_1$ are spaced apart from the first surface 101, that is, the epitaxial layer 141 is not removed down to the first region sections $21_1$. In order to complete the first regions 21, the method, referring to FIG. 11D, further includes implanting first type dopant atoms via an implantation mask 301 into the second semiconductor layer 140 and, referring to FIG. 11E, a second temperature process. According to one example, the implantation process forms implantation regions 25 between the first region sections $21_1$ and the first surface 101. In the temperature process, dopant atoms from the implantation regions 25 diffuse and are activated. This diffusion and activation process generates further sections $21_2$ of the first regions 21. These further sections $21_2$ adjoin the first sections $21_1$ and extend to the first surface 101 so that first regions 21 are formed to extend to the first surface 101 of the semiconductor body 100 and the second semiconductor layer 140. Those sections of the second region section $22_1$ that remain after forming the second sections $21_2$ of the first regions 21 form the second regions 22. According to one example, an implantation dose in the implantation process is selected from between 1E11 $cm^{-2}$ and 5E13 $cm^{-2}$.

Figure 12:
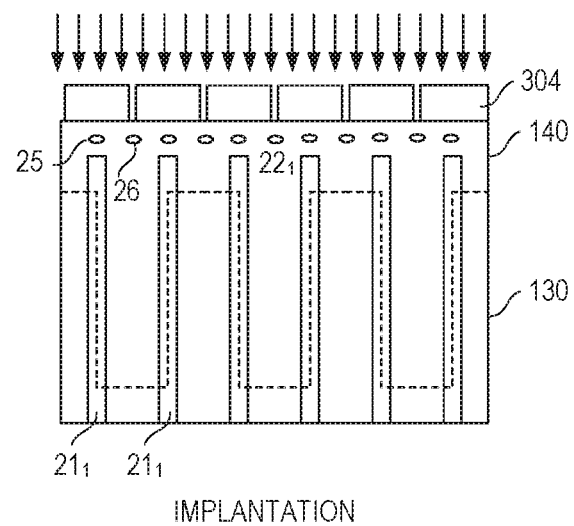
FIG. 12 illustrates a modification of the method shown in FIGS. 11A to 11E.

Optionally, the method explained with reference to FIGS. 11A to 11E further includes implanting second type dopant atoms into the second epitaxial layer. FIG. 12 shows a vertical cross sectional view of the first and second epitaxial layers 130, 140 during this implantation process. This implantation may take place before or after implanting the first type dopant atoms that form the implantation regions 25. Just for the purpose of illustration, in the example shown in FIG. 12, the second type dopant atoms are implanted after the first type dopant atoms have been implanted. Referring to FIG. 12, in this implantation process second type dopant atoms are implanted via another implantation mask 304 into the second epitaxial layer 140, wherein the these second type dopant atoms are implanted into regions of the second epitaxial layer 140 between the implantation regions 25 with the first type dopant atoms so that implantation regions 25 including first type dopant atoms and implantation regions 26 including second type dopant atoms are arranged alternately in the lateral direction of the second epitaxial layer 140. The dopant atoms included in implantation regions 25 and 26 may be diffused and activated in the same temperature process, such as the temperature process explained with reference to FIG. 12.

Referring to FIG. 11B, the second type dopant atoms may diffuse up to the surface 142 of the epitaxial layer so that the second semiconductor layer 140 after the removal process shown in FIG. 11C includes second type dopant atoms up to the surface 101, that is, the second region section $22_1$ extends up to the surface 101. However, the doping concentration may decrease towards the surface 101. The implantation process explained with reference to FIG. 12 may help to increase the doping concentration of second type dopant atoms in a region between the surface 101 and the first region sections $21_1$.

According to one example, in the method explained with reference to FIGS. 11A to 11E as well as in any of the methods explained below, first type dopant atoms implanted in the second epitaxial layer 140 are selected such that they diffuse faster than the first type dopant atoms implanted into the sidewalls of the trenches 131 (see FIGS. 10A and 10B). According to one example, the first type dopant atoms implanted into the second epitaxial layer 140 include phosphorous (P) atoms. The second type dopant atoms implanted into the first epitaxial layer 140 may be dopant atoms of the same type as implanted into the sidewalls of the trenches, so that the dopant atoms implanted into the sidewalls and the dopant atoms implanted into the second epitaxial layer 140 have the same diffusion coefficient (diffusion rate).

Referring to FIG. 13A, the method according to FIGS. 13A to 13F includes forming a first epitaxial layer $140_1$ on the first semiconductor layer 130. According to one example, the first epitaxial layer $140_1$ is formed such that it fills the trenches in the first semiconductor layer 130, but that the surface of the first epitaxial layer $140_1$ is not planar. That is, the first epitaxial layer $140_1$ includes recesses above positions of the former trenches 131 (see FIGS. 10A and 10B) of the first semiconductor layer 130. According to one example, the first epitaxial layer $140_1$ is formed such that a thickness $d_{140\_1}$ of the first epitaxial layer on top of the mesa regions of the first semiconductor layer 130 is between 0.5 times and 0.9 times the width $w_{131}$ of the trenches 131 (see FIG. 10A).

In the example shown in FIGS. 13A and 13B, dopant atoms of both types have been implanted into both, the first and second sidewalls so that each of the first and second implantation regions 23, 24 includes first type and second type dopant atoms. These dopant atoms diffuse during the temperature process. In this example, the first epitaxial layer $141$ may be non-doped (intrinsic). According to another example, each of the first and second implantation regions 23, 24 includes first type dopant atoms, only. In this case, the first epitaxial layer $140_1$ is formed to have a basic doping of the second doping type.

Referring to FIG. 133, the method further includes a first temperature process in which dopant atoms from the first and second implantation regions 23, 24 diffuse and are activated. Like in the example explained with reference to FIGS. 11A and 11B, in the example shown in FIGS. 13A and 13B first type dopant atoms and second type dopant atoms are included in the first and second implantation regions 23, 24 so that based on each of these implantation regions 23, 24 one first region section $21_1$ and one second region section $22_1$ is formed, wherein the second region sections adjoin each other so that in the example illustrated in FIG. 13B there is only one second region section $22_1$ located between the several first region sections $21_1$. The temperature process may include a thermal oxidation process so that an oxide layer 152 may be formed on the surface of the first epitaxial layer $140_1$ during the temperature process. Referring to FIG. 13C, after removing the oxide layer 152, the method further includes implanting first type dopant atoms into the first epitaxial layer $140_1$ via an implantation mask $302_1$.

Referring to FIG. 13D, the method further includes forming a second epitaxial layer $140_2$ on top of the first epitaxial layer $140_1$ and implanting first type dopant atoms into the second epitaxial layer $140_2$ via, another implantation mask $302_2$. The second epitaxial layer $140_2$ is formed such that it fills the recesses in the first epitaxial layer $140_1$ and has a substantially planar surface. That is, a thickness of the second epitaxial layer $140_2$ is great enough for the second epitaxial layer $140_2$ to have a planar surface. According to one example, the second epitaxial layer $140_2$ is formed such that a thickness $d_{140\_2}$ of the second epitaxial layer on top of the first epitaxial layer $140_1$ is between 0.3 times and 1 time the width $w_{131}$ of the trenches 131 (see FIG. 10A). In the first implantation process illustrated in FIG. 13C and the second implantation process illustrated in FIG. 13D, the dopant atoms are implanted in such a way that implantation regions $25_1$ resulting from the first implantation process and implantation regions $25_2$ resulting from the second implantation process are located between the first region sections $21_1$ and the surfaces of the first and second epitaxial layers $141_1$, $140_2$.

According to one example, the second epitaxial layer $140_2$ is non-doped (intrinsic). In this case, the method includes a further implantation process shown in FIG. 13E. In this implantation process second type dopant atoms are implanted via another implantation mask 303 into the second epitaxial layer $140_2$. Referring to FIG. 13E, these second type dopant atoms are implanted into regions of the second epitaxial layer $140_2$ between the second implantation regions $25_2$. Reference number 26 in FIG. 13E denotes implantation regions resulting from this implantation process illustrated in FIG. 13E.

Referring to FIG. 13F, the method includes a second temperature process. In this temperature process, dopant atoms implanted in the implantation processes, illustrated in FIGS. 13C to 13E diffuse and are activated. The dopant atoms included in the first and second implantation regions $25_1$, $25_2$ form further sections $21_2$ of the first regions. These further sections $21_2$ adjoin the first sections $21_1$ and extend to the surface of the second epitaxial layer $140_2$, which forms the surface 101 of the semiconductor body 100. Second type dopant atoms in the implantation regions 26 resulting from the implantation process illustrated in FIG. 13E form further sections $22_2$ of the second regions 22, so that sections $22_1$ and section $22_2$ form the second regions 22, and sections $21_1$, $21_2$ form the first regions 21.

According to one example, the second epitaxial layer $140_2$ is in-situ doped with second type dopant atoms during the epitaxial growth process so that the second epitaxial layer $140_2$ includes a basic dopant of the second type. In this case, implanting second type dopant atoms, as illustrated in FIG. 13E, can be omitted. In this example, an implantation dose of the first type dopant atoms implanted in the implantation process illustrated in FIGS. 13C and 13D is selected such that these dopant atoms locally over-compensate the second type basic doping of the second epitaxial layer $140_2$, so that the second sections $21_2$ with an effective doping of the first doping type are formed.

Figure 14A:
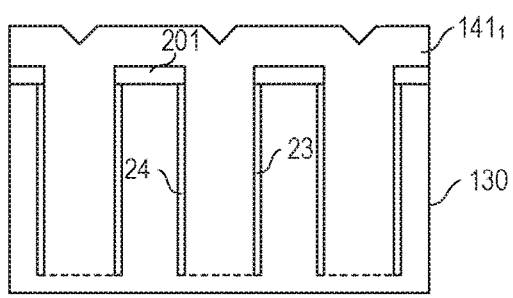
FIGS. 14A to 14D illustrate yet another example of a method for forming the second semiconductor layer on the first semiconductor layer and for forming doped regions in the second semiconductor layer.
Figure 14B:
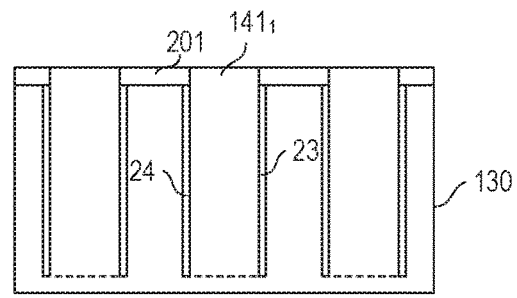
Figure 14C:
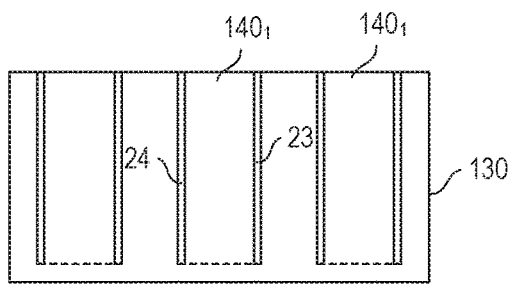

Referring to FIG. 14A, the method illustrated in FIGS. 14A to 14C includes forming a first epitaxial layer $141_1$ on the first semiconductor layer 130. In this example, the etch mask 201 is still in place on top of the mesa regions of the first semiconductor layer 130 when the first epitaxial layer $141_1$ is formed. According to one example, the first epitaxial layer $141_1$ is formed such that a surface of the first epitaxial layer $141_1$ is not planar. That is, the first epitaxial layer $141_1$ includes recesses at positions that are located above positions of the former trenches (see 131 in FIGS. 10A and 10B) in the first semiconductor layer 130.

Referring to FIG. 14B, the method includes removing the first epitaxial layer $141_1$ down to the etch mask 201. Removing the first epitaxial layer $141_1$ may include a planarizing process in which the etch mask 201 acts as a stop layer. That is, the planarizing process stops when the planarizing process of the etch mask 201 is uncovered. The planarizing process includes a CMP (chemical mechanical polishing) process, for example.

Referring to FIG. 14C, the method further includes removing the etch mask 201 and further sections of the first epitaxial layer $141_1$ so that a widely planar surface is obtained and the first epitaxial layer $141_1$ only remains in the former trenches of the first epitaxial layer 130. Reference numbers $140_1$ in FIG. 14C denote those sections of the first epitaxial layer $141_1$ remaining after this removing process. The removal process may include a dry etch process that is selected such that it etches the first epitaxial layer $141_1$ and the etch mask at substantially the same etch rate.

Figure 14D:
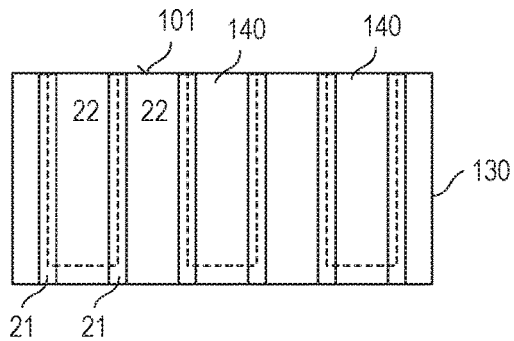

Referring to FIG. 14D, the method further includes a temperature process. In this temperature process, dopant atoms from the implantation region 23 and 24 diffuse in the first semiconductor layer 130 and the remaining sections $140_1$ of the first epitaxial layer $141_1$, wherein these sections $140_1$ form the second semiconductor layer 140 in this example. In the example shown in FIGS. 14A to 14D dopant atoms of both types have been implanted into both, the first and second sidewalls so that each of the first and second implantation regions 23, 24 includes both first and second type dopant atoms, wherein the first type dopant atoms form the first regions 21 and the second type dopant atoms form the second regions 22. In this example, the first epitaxial layer $141_1$ may be non-doped (intrinsic). According to another example, each of the first and second implantation regions 23, 24 includes first type dopant atoms, only. In this case, the first epitaxial layer $141_1$ is formed to have a basic doping of the second doping type.

Figure 15A:
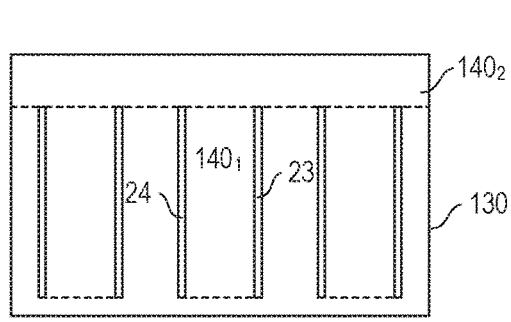
FIGS. 15A to 15D show a modification of the method shown in FIGS. 14A to 14D.

FIGS. 15A to 15D illustrate a modification of the method shown in FIGS. 14A to 14D. Referring to FIG. 15A, this method includes, after etching back the first epitaxial layer $141_1$, as shown in FIG. 14C, forming another epitaxial layer $140_2$ on the mesa regions of the first semiconductor layer 130 and the sections $140_1$ of the first epitaxial layer $141_1$ that fill the trenches. The structure illustrated in FIG. 14C has a substantially planar surface, so that the second epitaxial layer $140_2$ is grown with a substantially planar surface.

Figure 15B:
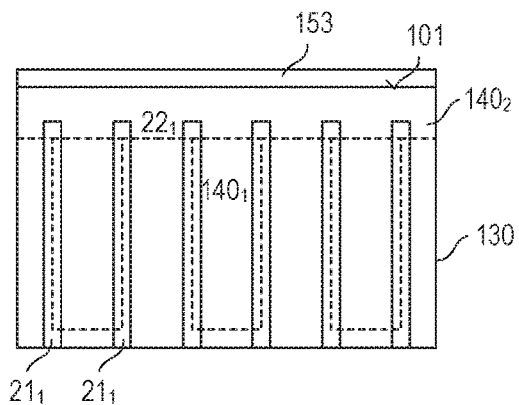

Referring to FIGS. 15B, the method further includes a first temperature process in which dopant atoms from the first implantation regions 23 and the second implantation regions 24 diffuse and are activated. Like in the examples explained before, the implantation regions 23 and 24 may include first type dopant atoms and second type dopant atoms so that from each of these first and second implantation regions 23, 24 one first region section $21_1$ and one second region section $22_1$ is formed, wherein by virtue of the greater diffusion coefficient of the second type dopant atoms the second region sections $22_1$ form one second region section $22_1$ between the several first region sections $21_1$. The first epitaxial layer $141_1$ and the second epitaxial layer $141_2$ may be non-doped in this example. According to another example, each of the first and second implantation regions 23, 24 includes first type dopant atoms, only. In this case, the first epitaxial layer $141_1$ and the second epitaxial layer $141_2$ may be formed to have a basic doping of the second doping type.

Figure 15C:
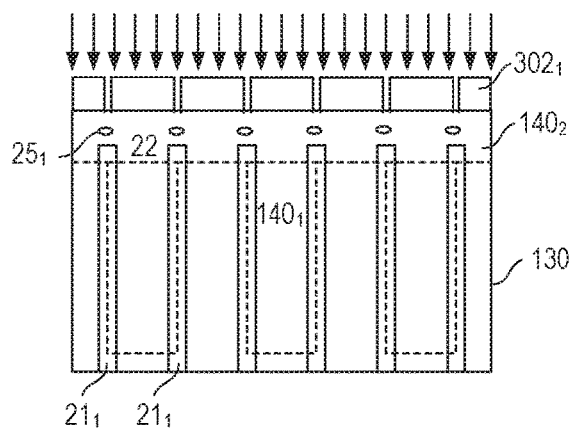

Referring to FIG. 15C, the method further includes implanting first type dopant atoms into the second epitaxial layer $140_2$ via an implantation mask $302_1$. Implantation regions $25_1$ that include the first type dopant atoms are produced between the first region sections $21_1$ and a surface of the second epitaxial layer $140_2$, which forms the surface 101 of the semiconductor body.

Figure 15D:
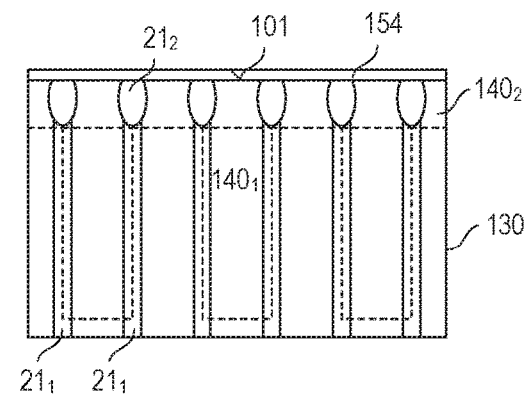

Referring to FIG. 15D, the method further includes a second temperature process in which further sections $21_2$ of the first regions are formed. These further sections $21_2$ adjoin the first region sections $21_1$ and extend to the first surface 101. Each of the first and second temperature processes illustrated in FIGS. 15B and 15D may include a thermal oxidation process in which an oxide layer 153, 154 is formed. The oxide layer 153 illustrated in FIG. 15B is removed before the implantation process, and the oxide layer 154 illustrated in FIG. 15D is removed before further process steps in which the control cells 30 are produced.

Figure 16A:
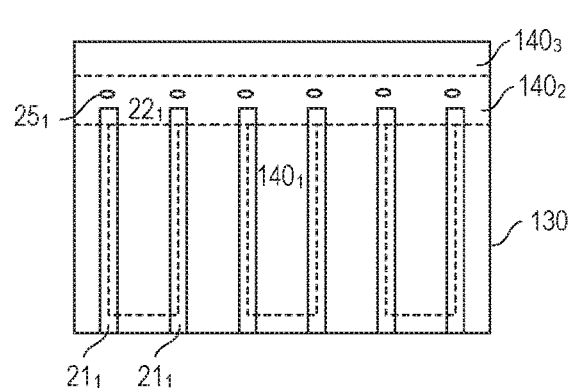
FIGS. 16A to 16D illustrate a modification of the method shown in FIGS. 15A to 15D.
Figure 16B:
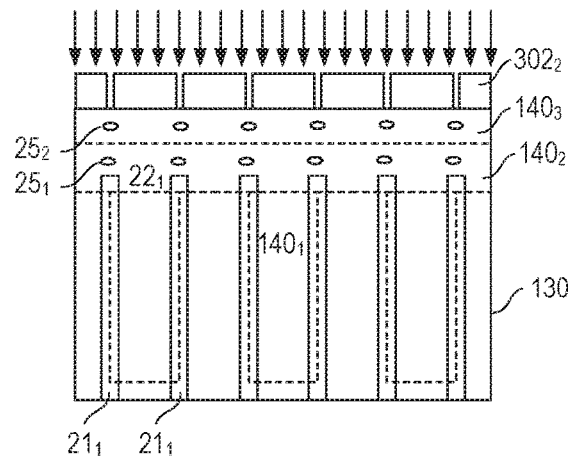
Figure 16C:
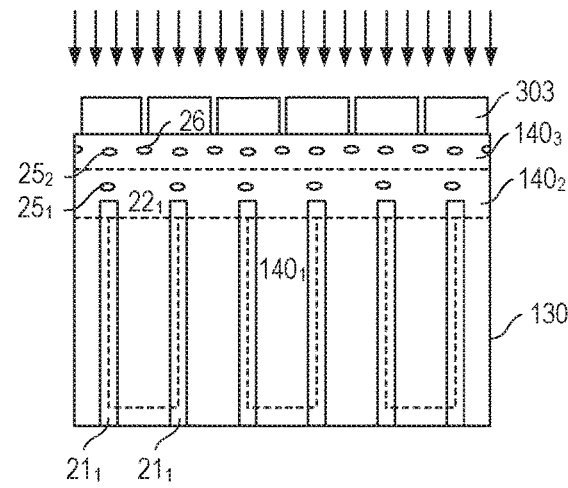

FIGS. 16A to 16D illustrate a modification of the method explained with reference to FIGS. 13A to 13G. Referring to FIG. 16A, this method includes forming a third epitaxial layer $140_3$ of the second epitaxial layer $140_2$. Referring to FIGS. 16B and 16C, the method further includes implanting first type dopant atoms using a first implantation mask $302_2$ into the third epitaxial layer $140_3$, and implanting second type dopant atoms using a second implantation mask 303 into the third epitaxial layer $140_3$. Referring to FIG. 16C, implantation regions 26 that include the second type dopant atoms are formed between implantation regions $25_2$ that include first type dopant atoms and are formed in the implantation process illustrated in FIG. 16D.

Figure 16D:
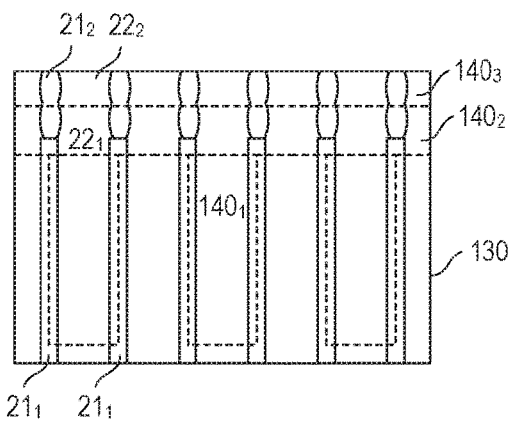

Referring to FIG. 16D, the method further includes another temperature process in which further sections $21_2$ of the first regions 21 are formed from the implantation regions $25_1$, $25_2$ included in the first type dopant atoms and further sections $22_2$ of the second regions 22 are formed from second type dopant atoms included in the implantation regions 26. The sections 21₁, 21₂ form the first regions 21 and the sections 22₁, 22₂ form the second regions 22 of the transistor device.

According to one example, the third epitaxial layer 140₃ is formed such that it has a basic doping of the second doping type. In this case, the implantation process illustrated in FIG. 14C can be omitted.

In the methods explained above there are two temperature processes. A first temperature process diffuses and activates dopant atoms from the first and second implantation regions 23, 24, and a second temperature process diffuses and activates the dopant atoms implanted into the second semiconductor layer 140. "Implanting into the second semiconductor layer 140" in this context means implanting at any stage of forming the second semiconductor layer 140. According to one example, the first temperature process is omitted so that there is only the second temperature process in which both dopant atoms from the first and second implantation regions 23, 24, and dopant atoms implanted into the second semiconductor layer 140 are activated. Referring to the above, forming the body and source regions 31, 32 includes at least one further temperature process which activates implanted dopant atoms that form these body and source regions 31, 32. This temperature process is referred to as third temperature process in the following. According to one example, this third process is in addition to the first temperature process and the second temperature process so that there are three temperature processes.

According to another example, the first temperature process is omitted and the third temperature process is in addition to the second temperature process so that there are only two temperature processes, the second process that diffuses and activates the dopant atoms implanted into the trench sidewalls of the first semiconductor layer 130 and into the second semiconductor layer 140 in order to form the first and second regions 21, 22, and the third process, which may include two sub-processes, that activates the dopant atoms implanted into the second semiconductor layer 140 in order to form the body and source regions 31, 32. According to yet another example, the second temperature process is omitted so that the third process is in addition to the first process. In this case, there are two temperature processes, the first process that diffuses and activates the dopant atoms implanted into the trench sidewalls of the first semiconductor layer 130 and the third process, which may include two sub-processes, that diffuses and activates the dopant atoms implanted into the second semiconductor layer 140 to form sections of the first and second regions 21, 22 and the dopant atoms implanted to form the source and body regions 32, 31. The first sub-process may be adapted to activate and diffuse the dopant atoms implanted into the second semiconductor layer 140 to form sections of the first and second regions 21, 22 and dopant atoms implanted to form the body regions 31. The second sub-process may be adapted to activate the dopant atoms implanted to form the source regions 32.

According to one example, a duration of the first temperature process is selected from between 200 minutes (min) and 600 min and the temperature is selected from between 1000° C. and 1200° C., and a duration of the second temperature process is selected from between 20 min and 200 min and the temperature is selected from between 1000° C. and 1200° C. According to one example, the first temperature process takes place in an oxidizing atmosphere. Optionally, the second temperature process also takes place in an oxidizing atmosphere.

The third temperature process may include a first sub-process that diffuses and activates the implanted dopant atoms that form the body regions, and a second sub-process that activates the implanted dopant atoms that form the source regions. In this example, the first sub-process takes place before implanting the dopant atoms that form the source regions. According to one example, a duration of the first sub-process is selected from between 30 min and 200 min and a temperature is selected from between 1000° C. and 1200° C. According to one example, a duration of the second sub-process is selected from between 15 min and 60 min and a temperature is selected from between 900° C. and 1000° C.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method, comprising:
   forming a plurality of first regions of a first doping type and a plurality of second regions of a second doping type in a first semiconductor layer and a second semiconductor layer such that the first regions and the second regions are arranged alternately in at least one horizontal direction of the first and second semiconductor layers; and
   forming a control structure with a plurality transistor cells each including at least one body region, at least one source region and at least one gate electrode in the second semiconductor layer,
   wherein forming the first regions and the second regions comprises:
   forming a plurality of trenches in the first semiconductor layer and implanting at least one of first type dopant atoms and second type dopant atoms into sidewalls of the plurality of trenches;
   forming the second semiconductor layer on the first semiconductor layer such that the second semiconductor layer fills the plurality of trenches in the first semiconductor layer;
   implanting at least one of first type dopant atoms and second type dopant atoms into the second semiconductor layer, and
   at least one temperature process.

2. The method of claim 1, wherein forming the second semiconductor layer comprises forming an epitaxial layer on the first semiconductor layer and partially removing the epitaxial layer.

3. The method of claim 2, wherein forming the epitaxial layer comprises forming the epitaxial layer such that the epitaxial layer has a generally planar surface.

4. The method of claim 2, wherein partially removing the epitaxial layer comprises an etching process.

5. The method of claim 2,
   wherein the at least one temperature process comprises a first temperature process before or after partially removing the epitaxial layer and before implanting the at least one of the first type dopant atoms and the second type dopant atoms into the second semiconductor layer, and
   wherein the at least one temperature process comprises a further temperature process after implanting the at least one of the first type dopant atoms and the second type dopant atoms into the second semiconductor layer.

6. The method of claim 5,
wherein forming the source region and the body region comprises implanting dopant atoms into the second semiconductor layer, and
wherein the further temperature process is performed after implanting the dopant atoms.

7. The method of claim 2, wherein forming the epitaxial layer comprises forming the epitaxial layer in the trenches and on mesa regions of the first semiconductor layer.

8. The method of claim 2, wherein the first epitaxial layer is a non-doped layer.

9. The method of claim 2, wherein implanting at least one of first type dopant atoms and second type dopant atoms into the second semiconductor layer comprises only implanting first type dopant atoms.

10. The method of claim 2, wherein implanting the at least one of first type dopant atoms and second type dopant atoms into the second semiconductor layer comprises an implantation process using an implantation mask.

11. The method of claim 1, wherein forming the second semiconductor layer comprises:
forming a first epitaxial layer on top of the first semiconductor layer such that the first epitaxial layer fills the plurality of trenches in the first semiconductor layer; and forming a second epitaxial layer on top of the first epitaxial layer.

12. The method of claim 11, wherein forming the second epitaxial layer comprises forming the second epitaxial layer such that it has an essentially planar surface.

13. The method of claim 11, wherein implanting at least one of the first type dopant atoms and second type dopant atoms into the second semiconductor layer comprises:
implanting at least one of first type dopant atoms and second type dopant atoms into the first epitaxial layer before forming the second epitaxial layer; and
implanting at least one of first type dopant atoms and second type dopant atoms into the second epitaxial layer.

14. The method of claim 13,
wherein implanting at least one of first type dopant atoms and second type dopant atoms into the first epitaxial layer before forming the second epitaxial layer comprises only implanting first type dopant atoms, and
wherein implanting at least one of first type dopant atoms and second type dopant atoms into the second epitaxial layer comprises implanting both first type dopant atoms and second type dopant atoms.

15. The method of claim 14,
wherein only implanting the first type dopant atoms comprises an implantation process using an implantation mask, and
wherein implanting both the first type dopant atoms and the second type dopant atoms each includes an implantation process using an implantation mask.

16. The method of claim 11, wherein the at least one temperature process comprises:
a first temperature process after forming the first epitaxial layer and before forming the second epitaxial layer; and
a further temperature process after forming the second epitaxial layer.

17. The method of claim 16,
wherein forming the source region and the body region comprises implanting dopant atoms into the second semiconductor layer, and
wherein the further temperature process is performed after implanting the dopant atoms.

18. The method of claim 11, wherein forming the first epitaxial layer comprises forming the first epitaxial layer in the trenches and on mesa regions of the first semiconductor layer.

19. The method of claim 11, wherein at least one of the first epitaxial layer and the second epitaxial layer is a non-doped layer.

20. The method of claim 11, wherein at least one of the first epitaxial layer and the second epitaxial layer has a basic doping of a first or a second doping type.

21. The method of claim 1, wherein forming the second semiconductor layer comprises:
forming a first epitaxial layer on the first semiconductor layer such that the first epitaxial layer fills the trenches of the first semiconductor layer;
partially removing the first epitaxial layer; and
forming a second epitaxial layer on the first epitaxial layer.

22. The method of claim 21, wherein partially removing the first epitaxial layer comprises at least one of an etching and a polishing process.

23. The method of claim 21,
wherein forming the first epitaxial layer comprises forming the first epitaxial layer in the trenches and on top of a stop layer arranged on mesa regions of the first semiconductor layer,
wherein partially removing the first epitaxial layer comprises removing the first epitaxial layer down to the stop layer and, subsequently, removing sections of the first epitaxial layer next to the stop layer and the stop layer.

24. The method of claim 21, further comprising:
forming a third epitaxial layer on the second epitaxial layer.

25. The method of claim 21, wherein the at least one temperature process comprises a temperature process after forming the second semiconductor layer.

26. The method of claim 21, wherein implanting at least one of the first type dopant atoms and second type dopant atoms into the second semiconductor layer comprises implanting at least one of the first type dopant atoms and second type dopant atoms into the second epitaxial layer.

27. The method of claim 1, wherein implanting first type dopant atoms and second type dopant atoms into sidewalls of the plurality of trenches comprises:
implanting first type dopant atoms into first sidewalls of the plurality of trenches; and
implanting second type dopant atoms into second sidewalls opposite the first sidewalls of the plurality of trenches.

28. The method of claim 1, wherein implanting first type dopant atoms and second type dopant atoms into sidewalls of the plurality of trenches comprises implanting both first type dopant atoms and second type dopant atoms into both first sidewalls of the plurality of trenches and second sidewalls opposite the first sidewalls of the plurality of trenches.

* * * * *

UNITED STATES PATENT AND TRADEMARK OFFICE
CERTIFICATE OF CORRECTION

PATENT NO. : 10,553,681 B2  
APPLICATION NO. : 16/104465  
DATED : February 4, 2020  
INVENTOR(S) : H. Weber et al.

Page 1 of 1

It is certified that error appears in the above-identified patent and that said Letters Patent is hereby corrected as shown below:

On the Title Page

Inventors (72), please change "Daniel Tutac, St. Niklas an der Drau (DE)" to --Daniel Tutac, St. Niklas an der Drau AT--.

In the Claims

Column 16, Line 27 (Claim 1, Line 9), please insert --of-- after plurality.

Signed and Sealed this  
Fifth Day of May, 2020

Andrei Iancu  
*Director of the United States Patent and Trademark Office*